(12) United States Patent
Qian et al.

(10) Patent No.: US 11,574,862 B2
(45) Date of Patent: Feb. 7, 2023

(54) OPTIMAL SIGNAL ROUTING PERFORMANCE THROUGH DIELECTRIC MATERIAL CONFIGURATION DESIGNS IN PACKAGE SUBSTRATE

(71) Applicant: Intel Corporation, Santa Clara, CA (US)

(72) Inventors: Zhiguo Qian, Chandler, AZ (US); Gang Duan, Chandler, AZ (US); Kemal Aygün, Tempe, AZ (US); Jieying Kong, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 774 days.

(21) Appl. No.: 16/392,171

(22) Filed: Apr. 23, 2019

(65) Prior Publication Data

US 2020/0343175 A1 Oct. 29, 2020

(51) Int. Cl.
*H01L 23/48* (2006.01)
*H01L 23/498* (2006.01)
(Continued)

(52) U.S. Cl.
CPC ...... *H01L 23/49894* (2013.01); *H01L 21/481* (2013.01); *H01L 21/486* (2013.01);
(Continued)

(58) Field of Classification Search
CPC ......... H01L 23/49894; H01L 23/49822; H01L 29/49838; H01L 21/4857; H01L 21/481; H01L 21/486
(Continued)

(56) References Cited

U.S. PATENT DOCUMENTS

2002/0015293 A1* 2/2002 Akiba ..................... H01L 25/16
257/E23.114
2006/0103024 A1* 5/2006 Salmon ................ H05K 1/0271
257/E23.07
(Continued)

FOREIGN PATENT DOCUMENTS

EP 0 502 614 9/1992
JP 2002 093903 3/2002

OTHER PUBLICATIONS

Extended Search Report for European Patent Application No. 21196285.7, dated Feb. 10, 2022, 9 pages.
(Continued)

*Primary Examiner* — Phuc T Dang
(74) *Attorney, Agent, or Firm* — Schwabe, Williamson & Wyatt, P.C.

(57) ABSTRACT

Embodiments include package substrates and methods of forming the package substrates. A package substrate includes a first conductive layer in a first dielectric, a second dielectric over the first dielectric, and a second conductive layer in the second dielectric, where the second conductive layer includes first and second traces. The package substrate also includes a third conductive layer over the second dielectric, and a high dielectric constant (Dk) and low DK regions in the first and second dielectrics, where the high Dk region surrounds the first traces, and where the low Dk region surrounds the second traces. The high Dk region may be between the first and third conductive layers. The low Dk region may be between the first and third conductive layers. The package substrate may include a dielectric region in the first and second dielectrics, where the dielectric region separates the high Dk and low Dk regions.

19 Claims, 6 Drawing Sheets

(51) Int. Cl.
*H01L 21/48* (2006.01)
*H01L 23/66* (2006.01)
(52) U.S. Cl.
CPC .... *H01L 21/4857* (2013.01); *H01L 23/49822* (2013.01); *H01L 23/49838* (2013.01); *H01L 23/66* (2013.01)
(58) Field of Classification Search
USPC .......................................................... 257/774
See application file for complete search history.

(56) References Cited

U.S. PATENT DOCUMENTS

| | | |
|---|---|---|
| 2006/0285273 A1 | 12/2006 | Chang |
| 2007/0102806 A1 | 5/2007 | Horn et al. |
| 2017/0256478 A1* | 9/2017 | Sakamoto ............... H01L 24/82 |
| 2018/0190580 A1* | 7/2018 | Haba ....................... H01L 23/48 |
| 2018/0376594 A1 | 12/2018 | Hanao |

OTHER PUBLICATIONS

Search Report for European Patent Application No. 20164003.4, dated Aug. 17, 2020, 7 pages.

* cited by examiner

OPTIMAL SIGNAL ROUTING PERFORMANCE THROUGH DIELECTRIC MATERIAL CONFIGURATION DESIGNS IN PACKAGE SUBSTRATE

FIELD

Embodiments relate to packaging semiconductor devices. More particularly, the embodiments relate to semiconductor devices with different dielectric constant (Dk) regions within a single dielectric layer.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale these ICs, including package substrates, while optimizing the performance of each device, however, is not without issue.

Existing technologies typically implement package substrates with the same dielectric material and thickness across each of the dielectric layers. These package substrates also include conductive routings for both differential and single-ended input/output (I/O) interfaces. The routings of the package substrates further include different routing segments like a breakout routing and a main routing. These routing segments, however, typically have different—or even conflicting—routing demands for the substrate's dielectric material and stack-up configurations. Accordingly, due to conflicting packaging and routing demands, the existing package substrates compromise the signal performance of the different routing segments and interfaces.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Described herein are semiconductor packages with different dielectric constant (Dk) regions within a single dielectric layer and methods of forming such semiconductor packages. The semiconductor packages described below and methods of forming such semiconductor packages include a package substrate with a single-ended input/output (I/O) interface (or bus), a differential I/O interface, and a plurality of Dk regions within a dielectric (or a dielectric layer), according to some embodiments. For example, as described below in some embodiments, the package substrate may have a single routing layer with single-ended routing traces and differential routing traces, where the single-ended routing traces are surrounded with a higher Dk region (or a high-k dielectric region) and the differential routing traces are surrounded with a lower Dk region (or a low-k dielectric region). For some embodiments, the dielectric materials of the high and low Dk regions may surround (or embed) the routing traces below and above the routing layer at the designated respective regions.

As described herein, a "high-k dielectric" refers to a material (e.g., a dielectric material) having a higher dielectric constant (k) (or Dk) than traditional substrate build-up material. As such, a "high-k dielectric region" refers to a region (or a portion) in a single layer (or a first layer, a same layer, etc.) of the material, where the region has a higher Dk compared to another region in the single layer using the traditional substrate build-up material.

As described herein, a "low-k dielectric region" refers to a material having a lower dielectric constant than traditional substrate build-up material. As such, a "low-k dielectric region" refers to a region (or a portion) in a single layer (or a first layer) in the material, where the region has a lower dielectric constant compared to another region in the single layer using the traditional substrate build-up material.

The embodiments of the semiconductor packages described herein improve packaging solutions by substantially improving the performance of signal routing within package substrates with optimized Dk materials. For example, the package substrates described herein may have low Dk regions to reduce routing loss and high Dk regions to reduce impedance mismatch induced loss. Accordingly, the embodiments described herein improving packaging solutions by enabling a substrate process that may control the Dk in designated region(s) of the package substrate, thereby further enabling higher bandwidth and facilitating future bandwidth scaling of high-speed signaling.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages having package substrates with single-ended I/O interfaces, differential I/O interfaces, and different Dk regions within one or more dielectrics.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Figure 1:
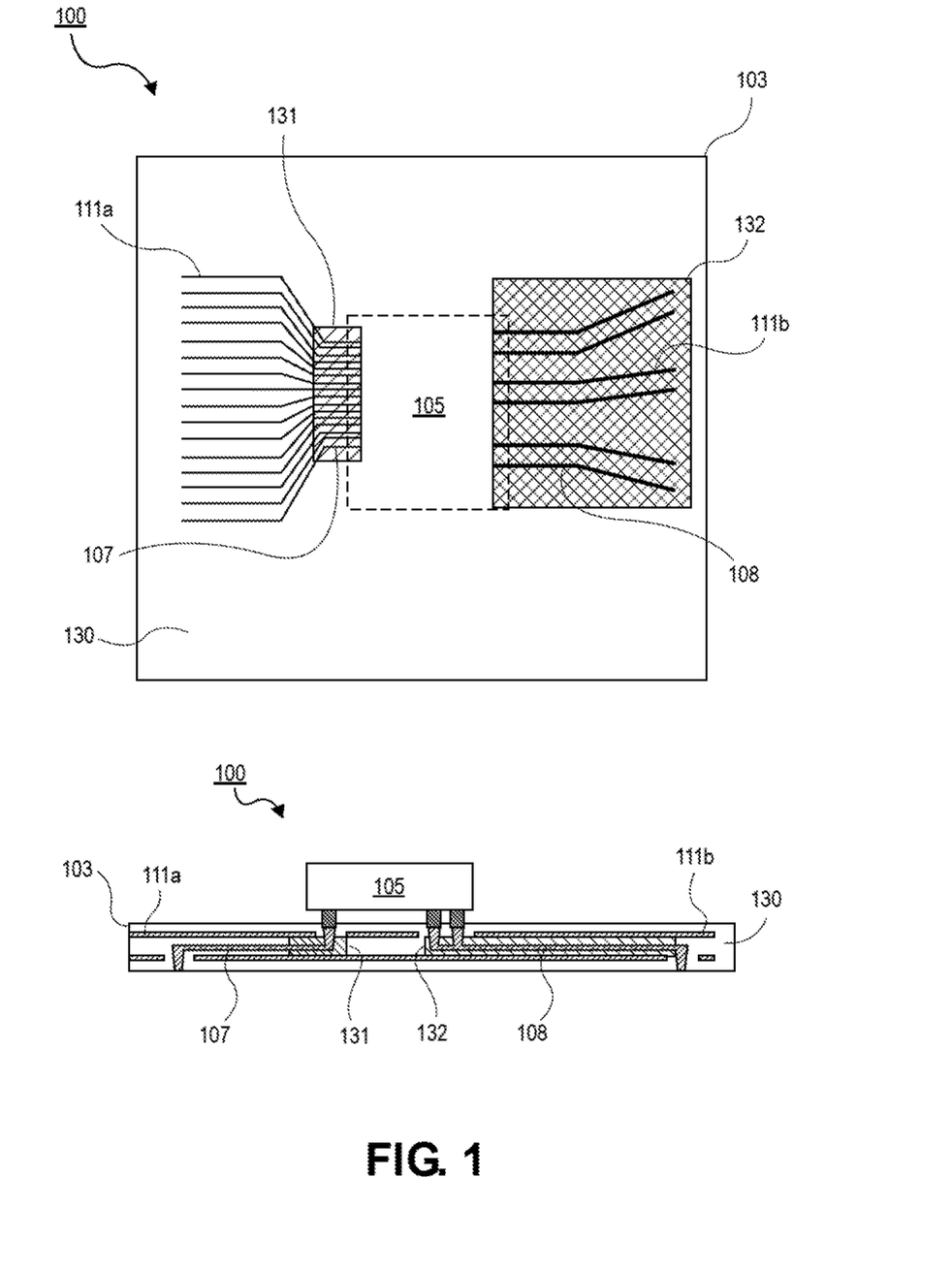
FIG. 1 is an illustration of a plan and cross-sectional view of a semiconductor package with a package substrate that includes a single-ended input/output (I/O) interface, a differential I/O interface, and a plurality of dielectric constant (Dk) regions within a dielectric, according to one embodiment.

Referring now to FIG. 1, top-view and cross-sectional illustrations of a semiconductor package 100 is shown, in accordance with an embodiment. In an embodiment, the semiconductor package 100 may include a package substrate 103. In an embodiment, the package substrate 103 may include a single-ended I/O routing interface 107 and a differential I/O routing interface 108. The package substrate 103 may have a routing layer that includes the single-ended and differential I/O interfaces 107-108. For one embodiment, the single-ended I/O interface 107 includes a plurality of single-ended routing traces 111a, and the differential I/O interface 108 includes a plurality of differential routing traces 111b.

In an embodiment, as shown in the top-view of FIG. 1, the package substrate 103 also includes a dielectric layer 130 with a high Dk region 131 and a low Dk region 132, particularly the dielectric layer 130 embeds/surrounds the high Dk region 131 and the low Dk region 132, where the other region(s) of the dielectric layer 130 may have a typical Dk as is known in the art (e.g., the typical Dk may be approximately 3.3 to 3.5). As described above, the package substrate 103 may have a routing layer with a portion of the single-ended routing traces 111a surrounded by the high Dk region 131 (as shown in FIG. 1), while the differential routing traces 111b are surrounded by the low Dk region 132, thereby enabling materials with different Dks to be disposed in specific signal routing regions to improve I/O performance of the semiconductor package 100. Note that the dielectric materials of the high and low Dk regions 131-132 may surround (or embed) the routing traces 111a-b below and above the respective routing layer at the designated respective regions 131-132 (i.e., as shown in FIGS. 3D and 4G, the routing traces may be completely embedded/surrounded with the high and low Dk materials).

According to some embodiments, the package substrate 103 may include alternating layers of build-up layers (or dielectric layers) and conductive routing layers (e.g., the copper routing traces 111a-b) as is known in the art. The package substrate 103 may include, but is not limited to, a substrate, a printed circuit board (PCB), and a motherboard. For one embodiment, the package substrate 103 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers 130 and Dk regions 131-132, where each dielectric layer can be a photosensitive dielectric layer having one or more different Dk regions. For some embodiments, holes may be drilled in the PCB 103. For one embodiment, the PCB 103 may also include routing layers (or conductive layers) with traces 111a-b (e.g., copper traces, pads, lines, planes, etc.), vias, interconnects, and holes.

Additionally, the die 105 may be disposed on the package substrate 103. In one embodiment, the die 105 may include a microelectronic device, a semiconductor die, an integrated circuit (IC), a central processing unit (CPU), a microprocessor, a platform controller hub (PCH), a memory, and/or a field-programmable gate array (FPGA). As described above, the die 105 may include both single-ended and differential I/O interfaces 107-108 for routing the single-ended and differential traces 111a-b (e.g., conductive (or copper) traces), respectively.

In some embodiments, as described above, the dielectric layer 130 may include one or more dielectric materials having a high-k dielectric, such as the high Dk region 131, where such dielectric materials may include hafnium, silicon, oxygen, titanium, tantalum, lanthanum, aluminum, zirconium, barium, strontium, yttrium, lead, scandium, niobium, zinc, magnesium, calcium, piezotech polymer, vinylidene fluoride polymer, and/or any other polymer with special additives and modified nano-structures. Examples of high-k materials of the one or more high Dk regions 131 that may be used in the dielectric layer 130 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, lead zinc niobate, silicon dioxide, silicon nitride, calcium oxide, hafnium silicate, zirconium silicate, piezotech polymer, vinylidene fluoride polymer, and/or any other polymers with special additives and modified nano-structures. Note that, in these embodiments, silicon dioxide may be defined as a high Dk material, since the Dk value of the silicon dioxide may be higher than the traditional substrate dielectric Dk value.

In alternate embodiments, the dielectric layer 130 may include one or more dielectric materials having a low-k dielectric material, such as the low Dk region 132. Examples of low-k materials of the one or more low Dk regions 132 that may be used in the dielectric layer 130 may include, but are not limited to, carbon-doped oxide, porous silicon dioxide, organic polymers such as perfluorocyclobutane, polytetrafluoroethylene, fluorosilicate glass, and/or organiosilicates, such as silsesquioxane, siloxane, or organosilicate glass, and/or polymers such as polyimide, polynorbornenes, benzocyclobutene, PTFE, and/or a combination of the above materials with modified structures and air gaps.

According to some embodiments, the dielectric regions 130-132 are in the package substrate 103, where the dielectric regions include the high Dk region 131, the low Dk region 132, and the dielectric region 130 (i.e., the dielectric region 130 refers to the traditional Dk region(s)). Additionally, in these embodiments, the die 105 is on the package substrate 103, where the die 105 has a first edge with the single-ended I/O routing region 107, and a second edge with the differential I/O routing region 108, and where the single-ended I/O routing region 107 of the first edge is opposite to the differential I/O routing region 108 of the second edge. Furthermore, as shown in FIG. 1, the high Dk region 131 includes the single-ended I/O routing region 107, while the low Dk region 132 includes the differential I/O routing region 108.

As described herein, the Dk values of the different Dk regions 131-132 may be tailored for any desired/specific application by reformulating one or more material compositions. For example, in one embodiment, the high Dk region 131 may have a Dk value of approximately 4 or greater. In other embodiments, the high Dk region 131 may have a Dk value of approximately 10 or greater. For one embodiment, the low Dk region 132 may have a Dk value of approximately 2.65 or less. In other embodiments, the low Dk region 132 may have a Dk value of approximately 3.2 or less. In one embodiment, the dielectric layer 130 may have a Dk value of approximately 3.3. In other embodiments, the dielectric layer 130 may have a Dk value of approximately 3.5. Note that, in the embodiments described herein, the Dk value of the dielectric is between the Dk value of the low Dk region and the Dk value of the high Dk region, where the Dk value of the high Dk region is greater than the Dk value of the low Dk value.

Furthermore, the low Dk region 132 improves the differential trace loss of the semiconductor package 100. For example, in one embodiment, the low Dk region 132 may have a Dk value of approximately 2.0, while the differential traces 111b may have a trace width of approximately 46 um or less. Accordingly, in this embodiment, the insertion loss of the semiconductor package 100 may be improved to approximately −0.88 dB/cm at 28 GHz without any impact to routing density.

Additionally, the high Dk region 131 improves the breakout impedance matching of the semiconductor package 100. For example, in one embodiment, the high Dk region 131 may have a Dk value of approximately 5.0, while the single-ended (or breakout) traces 111a may have a trace width of approximately 9 um or less. Accordingly, in this embodiment, the impedance of the semiconductor package 100 may be reduced to 48 Ohm at 10 GHz, which thus enables an improved impedance matching that avoids any signal reflections, and avoids limiting the channel performance, especially for higher speed scenarios.

Note that the semiconductor package 100 may include fewer or additional packaging components based on the desired packaging design.

Figure 2A:
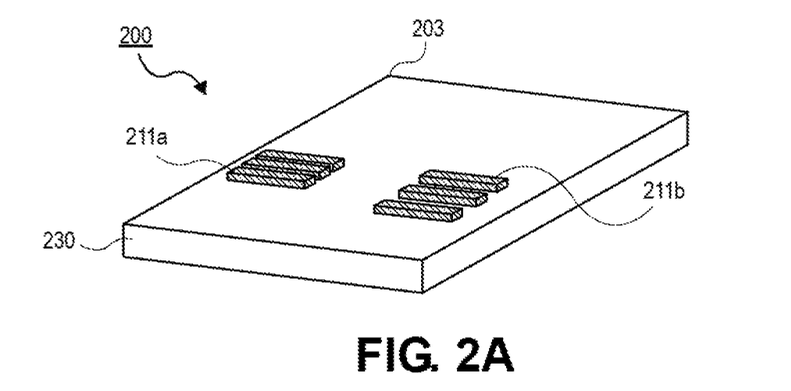
FIGS. 2A-2C are illustrations of perspective views of a process flow to form a semiconductor package with a package substrate that includes a single-ended I/O interface, a differential I/O interface, and a plurality of Dk regions within a dielectric, according to some embodiments.
Figure 2B:
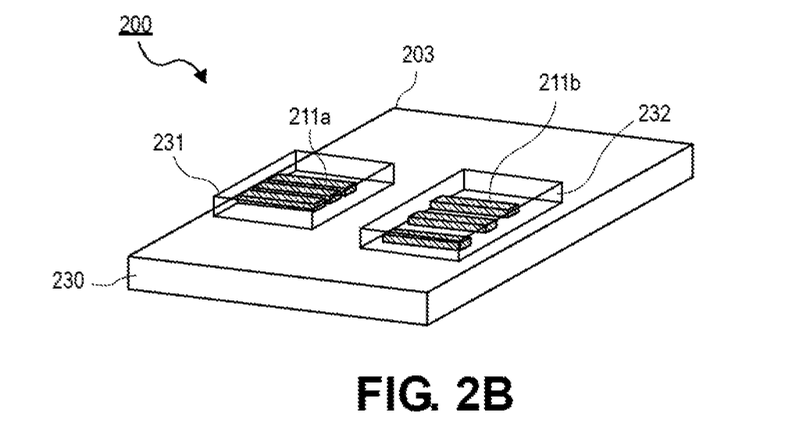
Figure 2C:
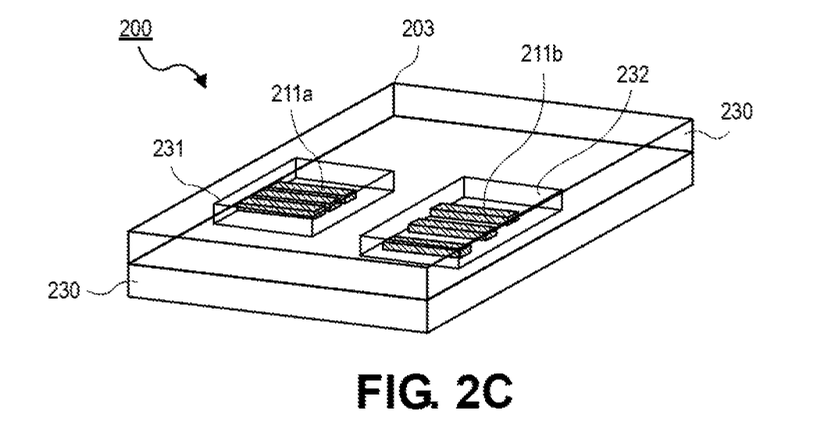

FIGS. 2A-2C are a series of perspective illustrations that depict a semiconductor package 200 with a package substrate 203 that includes a plurality of single-ended traces 211a, a plurality of differential traces 211b, and a plurality of Dk regions 231-232 within a dielectric layer 230, in accordance with an embodiment. Furthermore, FIGS. 2A-2C illustrate one of the approaches that implements a pick and place process to dispose a high Dk region 231 and a low Dk region 232 within a single dielectric layer 230, according to some embodiments.

Referring now to FIG. 2A, a cross-sectional illustration of a semiconductor package 200 is shown, in accordance with an embodiment. In an embodiment, the semiconductor package 200 may include a package substrate 203. The package substrate 203 may be substantially similar to the package substrate 103 described above in FIG. 1. In one embodiment, the package substrate 203 may include a dielectric layer 230. The package substrate 203 may include a stack of dielectrics. In one embodiment, a plurality of traces 211a-b (or copper traces) may be disposed on the dielectric layer 230. In an embodiment, the traces 211a may be a plurality of single-ended routing traces, and the traces 211b may be a plurality of differential routing traces. For example, the traces 211a may be used to form a single-ended breakout I/O interface, while the traces 211b may be used to form a differential I/O interface. For some embodiments, the traces 211a may have a width and a line spacing that are less than a width and a line spacing of the traces 211b. In one embodiment, the traces 211a-b may be implemented with a copper plating process such as a semi-additive plating (SAP) process or the like.

Referring now to FIG. 2B, a cross-sectional illustration of a semiconductor package 200 with high and low Dk regions 231-232 is shown, in accordance with an embodiment. In an embodiment, a high Dk region 231 may be disposed over the traces 211a and the dielectric layer 230. For one embodiment, the low Dk region 232 may be disposed over the traces 211b and the dielectric layer 230. The high and low Dk regions 231-232 may be substantially similar to the high and low Dk regions 131-132 described above in FIG. 1.

Additionally, even if not shown for simplicity, a high Dk region may be disposed below the traces 211a and the illustrated high Dk region 231 to entirely surround the traces 211a with the high Dk material of the high Dk regions 231. Likewise, even if not shown for simplicity, a low Dk region may be disposed below the traces 211b and the illustrated low Dk region 232 to entirely surround the traces 211b with the low Dk material of the low Dk regions 232.

In an embodiment, the high and low Dk regions 231-232 may be disposed over the respective traces 211a-b with high precision pick and place and lamination/planarization processes. For example, at the designated build-up layer(s) needing different Dk dielectric materials, pre-fabricated higher Dk and lower Dk dielectric materials/films may be picked and placed with high-accuracy at the designated regions, such as the high and low Dk regions 231-232, which enable the copper traces to be surrounded (e.g., below and/or above the conductive traces 211a-b).

In one embodiment, the high Dk region 231 of a single-ended breakout routing interface may have a footprint (or area) of approximately 8 mm×2 mm. The low Dk region 232 of a differential routing interface may cover a larger footprint of approximately 30 mm×20 mm, for example, depending on the number of differential pairs and so on, according to an embodiment.

Referring now to FIG. 2C, a cross-sectional illustration of a semiconductor package 200 with an additional dielectric layer 230 is shown, in accordance with an embodiment. In an embodiment, a second dielectric layer 230 is disposed over the high and low Dk regions 231-232 and the first dielectric layer 230. The second dielectric layer 230 may be substantially similar to the first dielectric layer 230. In some embodiments, after the pick and place of the high and low Dk regions 231-232, a cure step may be implemented to cure the respective regions, and then a lamination step may be implemented to encapsulate and cure the designated build-up layer with the second/subsequent dielectric layer 230. In additional embodiments, the stacked dielectric layers 230 may have the top surface flattened with a chemical mechanical planarization (CMP) process if needed. As described above, to optimize the signaling performance of the semiconductor package 200, the high and low Dk regions 231-232 may need to be disposed above, around and, below the signal routing traces 211a-b.

As described herein, the Dk values of the different Dk regions 231-232 may be tailored for any desired/specific application by reformulating one or more material compositions. For example, in one embodiment, the high Dk region 231 may have a Dk value of approximately 4 or greater. In other embodiments, the high Dk region 231 may have a Dk value of approximately 10 or greater. For one embodiment, the low Dk region 232 may have a Dk value of approximately 2.65 or less. In other embodiments, the low Dk region 231 may have a Dk value of approximately 3.2 or less. In one embodiment, the dielectric layer 230 may have a Dk value of approximately 3.3. In other embodiments, the dielectric layer 230 may have a Dk value of approximately 3.5.

Note that the semiconductor package 200 shown in FIGS. 2A-2C may include fewer or additional packaging components based on the desired packaging design.

FIGS. 3A-3D are a series of cross-sectional illustrations that depict a semiconductor package 300, in accordance with an embodiment. As described above, FIGS. 3A-3D illustrate one of the approaches that enables optimal signal routing performance for the semiconductor package 300 by implementing varying Dk values in in signal routing regions, such as the dielectric regions 330-332. In particular, FIGS. 3A-3D illustrate one of the approaches that implements a pick and place process to dispose a plurality of high Dk regions 331 and a plurality of low Dk regions 332 within a plurality of build-up dielectric layers 330, according to some embodiments.

Figure 3A:
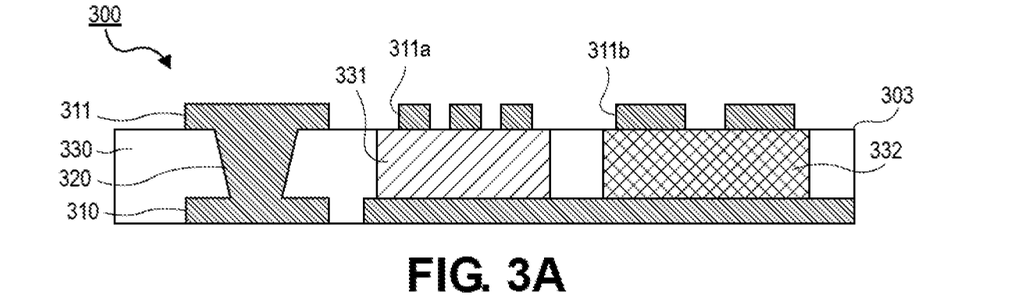
FIGS. 3A-3D are illustrations of cross-sectional views of a process flow using a pick and place method to form a semiconductor package with a package substrate that includes a single-ended I/O interface, a differential I/O interface, and a plurality of Dk regions within a dielectric, according to some embodiments.

Referring now to FIG. 3A, a cross-sectional illustration of a semiconductor package 300 is shown, in accordance with an embodiment. The semiconductor package 300 may be substantially similar to the semiconductor packages 100 and 200 described in FIGS. 1 and 2A-2C. While two dielectric layers 330, two high Dk regions 331, and two low Dk regions 332 are illustrated, it is to be appreciated that any number (or combination) of dielectric layers 330 and high and low Dk regions 331-332 may be disposed in the package substrate 303. Similar to the semiconductor packages above, the high and low Dk regions 331-332 include high Dk values and low Dk values, respectively.

In an embodiment, the semiconductor package 300 may include a package substrate 303. The package substrate 303 may have a stack of layers (or build-up layers) that include dielectric layers 330, conductive layers 310-311, and conductive routing traces 311a-b as is known in the art. In an embodiment, a second conductive layer 311 may be disposed over a first conductive layer 310 that are coupled by a plurality of first vias 320. The second conductive layer 311 may include a signal routing layer which includes a plurality of singled-ended routing traces 311a and a plurality of differential routing traces 311b.

The routing traces 311a-b are substantially similar to the routing traces 111a-b and 211a-b described above in FIGS. 1 and 2A-2C. For some embodiments, the traces 311a may have a width and a line spacing that are less than a width and a line spacing of the traces 311b. In one embodiment, the conductive layers 310-311, the traces 311a-b, and the vias 320 may be implemented with a copper plating process such as a SAP process or the like.

Additionally, in one embodiment, a high Dk region 331 and a low Dk region 332 may be disposed in the dielectric layer 330 with a pick and place process (or the like). As shown in FIG. 3A, the high Dk region 331 may be disposed below the single-ended routing traces 311a, and the low Dk region 332 may be disposed below the differential routing traces 311b. These high and low Dk regions 331-332 below the routing traces 311a-b are disposed in the first dielectric layer 330 to form the bottom Dk regions that subsequently surround the signal routing traces 311a-b entirely (as shown below in FIG. 3B). The high and low Dk regions 331-332 may be substantially similar to the high and low Dk regions 131-132 and 231-232 described above in FIGS. 1 and 2A-2C.

Figure 3B:
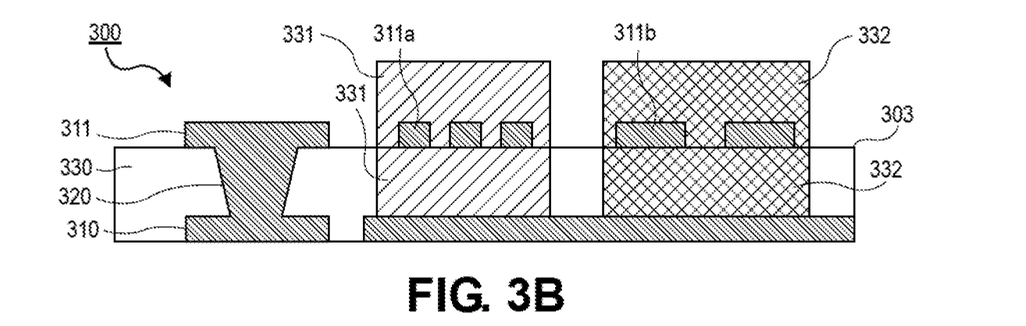

Referring now to FIG. 3B, a cross-sectional illustration of a semiconductor package 300 with high and low Dk regions 331-332 over the routing traces 311a-b is shown, in accordance with an embodiment. In an embodiment, a second layer of high and low Dk regions 331-332 may be disposed over a first layer of high and low Dk regions 331-332, thereby entirely surrounding the respective signal routing traces 311a-b using high precision pick and place and lamination/planarization processes. In one embodiment, the high Dk regions 331 may be implemented for a single-ended breakout routing interface and may have a footprint of approximately 8 mm×2 mm. In one embodiment, the low Dk regions 332 may be implemented for a differential routing interface and may cover a footprint of approximately 30 mm×20 mm. Accordingly, in some embodiments, the high Dk regions 331 may have a footprint that is greater than a footprint of the low Dk regions 332.

According to some embodiments, the Dk values of the high and low Dk regions 331-332 may be tailored for any desired/specific application by reformulating one or more material compositions. For example, in one embodiment, the high Dk region 331 may have a Dk value of approximately 4 or greater. In other embodiments, the high Dk region 331 may have a Dk value of approximately 10 or greater. For one embodiment, the low Dk region 332 may have a Dk value of approximately 2.65 or less. In other embodiments, the low Dk region 332 may have a Dk value of approximately 3.2 or less. In one embodiment, the dielectric layer 330 may have a Dk value of approximately 3.3. In other embodiments, the dielectric layer 330 may have a Dk value of approximately 3.5.

Figure 3C:
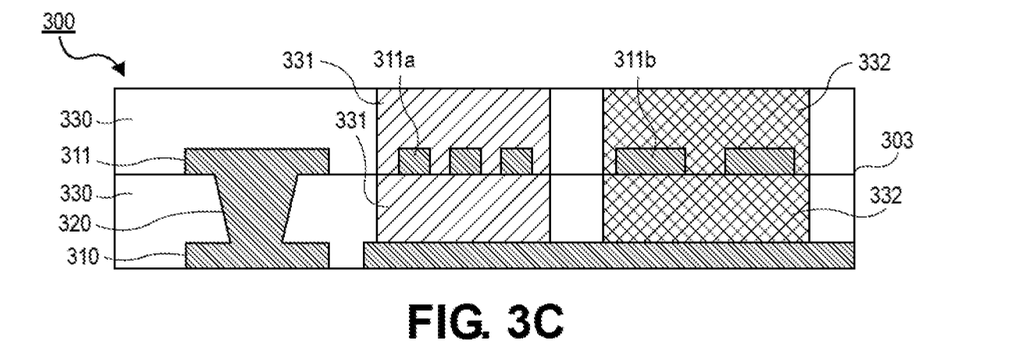
Figure 3D:
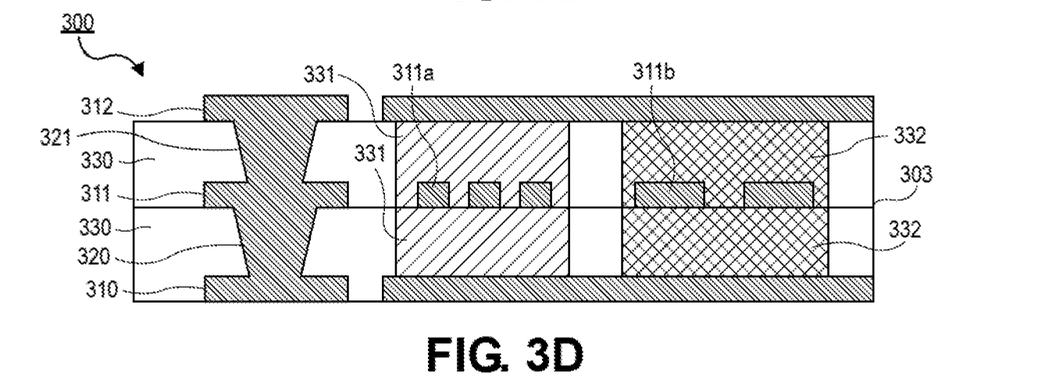

Referring now to FIG. 3C, a cross-sectional illustration of a semiconductor package 300 with a second dielectric layer 330 is shown, in accordance with an embodiment. In an embodiment, the second dielectric layer 330 may be disposed over the high and low Dk regions 331-332, the first dielectric layer 330, and the second conductive layer 311. The second dielectric layer 330 may be substantially similar to the first dielectric layer 330. In some embodiments, after the pick and place of the high and low Dk regions 331-332, a cure step may be implemented to cure the respective regions, and then a lamination step may be implemented to fully encapsulate and cure the designated build-up layer with the second dielectric layer 330.

In additional embodiments, the stacked dielectrics 330 and the different Dk regions 331-332 may have the top surface flattened with a CMP process if needed. As described above, to optimize the signaling performance of the semiconductor package 300, the high and low Dk regions 331-332 may need to be disposed above, around and, below the signal routing traces 311a-b. In one embodiment, the high and low Dk regions 331-332 may have top surfaces that are substantially coplanar to top surface of the second dielectric layer 330. In another embodiment, the high and low Dk regions 331-332 may have top surfaces that are below the top surface of the second dielectric layer 330. Additionally, as described above, the high and low Dk regions 331-332 may be pre-fabricated films having different materials with different Dk values as desired, where such films may be picked and placed at the designated locations (e.g., at the routing I/O interfaces), pressed as needed to ensure good adhesion with each other and/or the conductive layers/traces, and then cured to fully surround the respective routing traces 311a-b.

Referring now to FIG. 3D, a cross-sectional illustration of a semiconductor package 300 with a third conductive layer 312 and a plurality of second vias 321 is shown, in accordance with an embodiment. In an embodiment, the third conductive layer 312 may be disposed over the stacked dielectric layers 330 and the high and low Dk regions 331-332. The third conductive layer 312 may be coupled to the second conductive layer 311 with the vias 321. For some embodiments, the first and third conductive layers 310 and 312 may embed (or sandwich) the high and low Dk regions 331-332. In one embodiment, the third conductive layer 312 and vias 321 may be formed with any plating process, such as a SAP process or the like. In additional embodiments, the steps illustrated in FIGS. 3A-3D may be repeated as needed based on the desired application and/or packaging design.

Note that the semiconductor package 300 of FIGS. 3A-3D may include fewer or additional packaging components based on the desired packaging design.

FIGS. 4A-4G are a series of cross-sectional illustrations that depict a semiconductor package 400, in accordance with an embodiment. As described above, FIGS. 4A-4G illustrate another approach that enables optimal signal routing performance for the semiconductor package 400 by implementing varying Dk values in in signal routing regions, such as the dielectric regions 430-432. In particular, FIGS. 4A-4G illustrate another approach that implements a patterned photoimageable dielectric (PID) 440 to dispose a plurality of high Dk regions 431 and a plurality of low Dk regions 432 within a stack of dielectric layers 430 and 440, according to some embodiments.

Figure 4A:
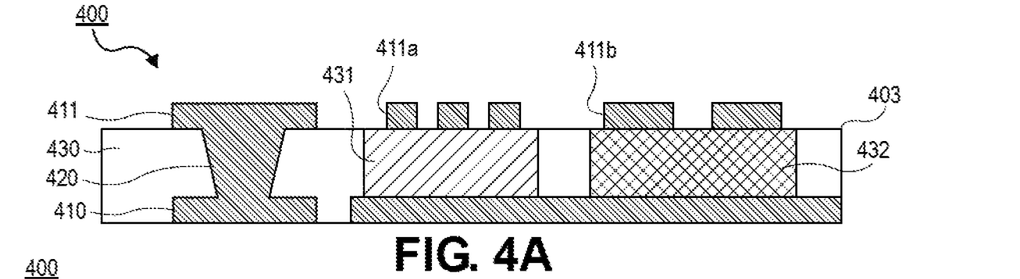
FIGS. 4A-4G are illustrations of cross-sectional views of a process flow to form a semiconductor package with a package substrate that includes a single-ended I/O interface, a differential I/O interface, a photoimageable dielectric, and a plurality of Dk regions within a dielectric, according to some embodiments.

Referring now to FIG. 4A, a cross-sectional illustration of a semiconductor package 400 is shown, in accordance with an embodiment. The semiconductor package 400 may be substantially similar to the semiconductor package 300 described in FIGS. 3A-3D, with the exception that a PID 440 with a normal Dk value is initially disposed at the designated locations to pattern a plurality of openings that may be disposed (or filled) with the high and low Dk materials of the high and low Dk regions 431-432. While two dielectrics 430 and 440, two high Dk regions 431, and two low Dk regions 432 are illustrated, it is to be appreciated that any number (or combination) of dielectric layers 430 and high and low Dk regions 431-432 may be disposed in the package substrate 403. Similar to the semiconductor packages above, the high and low Dk regions 431-432 include high Dk values and low Dk values, respectively.

In an embodiment, the semiconductor package 400 may include a package substrate 403. The package substrate 403 may have a stack of layers (or build-up layers) that include a dielectric 430, conductive layers 410-411, and conductive routing traces 411a-b as is known in the art. In an embodiment, a second conductive layer 411 may be disposed over a first conductive layer 410 that are coupled by a plurality of first vias 420. The second conductive layer 411 may include a signal routing layer which includes a plurality of singled-ended routing traces 411a and a plurality of differential routing traces 411b.

The routing traces 411a-b are substantially similar to the routing traces 311a-b described above in FIGS. 3A-3D. For some embodiments, the traces 411a may have a width and a line spacing that are less than a width and a line spacing of the traces 411b. In one embodiment, the conductive layers 410-411, the traces 411a-b, and the vias 420 may be implemented with a copper plating process such as a SAP process or the like.

Additionally, in one embodiment, a high Dk region 431 and a low Dk region 432 may be disposed in the dielectric layer 430 with a patterned PID (e.g., using a similar step as shown below in FIG. 4B-4F). As shown in FIG. 4A, the high Dk region 431 may be disposed below the single-ended routing traces 411a, and the low Dk region 432 may be disposed below the differential routing traces 411b. These high and low Dk regions 431-432 below the routing traces 411a-b are disposed in dielectric layer 430 to form the bottom Dk regions that subsequently surround the signal routing traces 411a-b entirely (as shown below in FIG. 4F). The high and low Dk regions 431-432 may be substantially similar to the high and low Dk regions 331-332 described above in FIGS. 3A-3D.

Figure 4B:
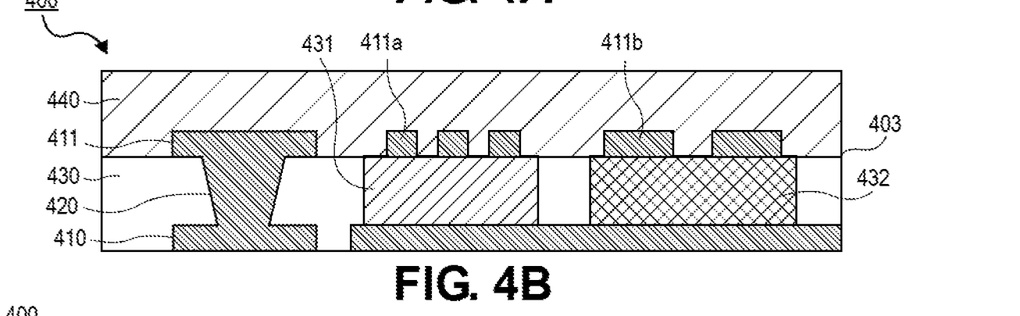

Referring now to FIG. 4B, a cross-sectional illustration of a semiconductor package 400 with a PID 440 is shown, in accordance with an embodiment. In an embodiment, the PID 440 may be disposed over the dielectric layer 430, the second conductive layer 411, and the routing traces 411a-b. For one embodiment, the PID 440 may have a normal Dk value as described herein. In one embodiment, the PID 440 may have a Dk value that is approximately equal to a Dk value of the dielectric layer 430.

Figure 4C:
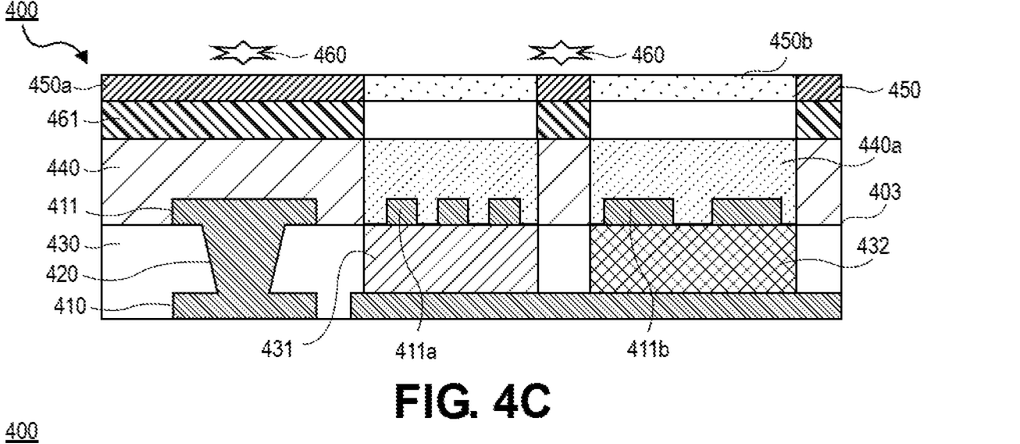

Referring now to FIG. 4C, a cross-sectional illustration of a semiconductor package 400 with a patterned mask 450 is shown, in accordance with an embodiment. In an embodiment, a mask 450 may be disposed over the PID 440 to pattern openings that are subsequently formed in the PID 440 as shown below in FIG. 4D. The mask 450 may be patterned with one or more intensity regions 450a-b that enable exposing and developing the PID 440 at the designation locations 440a to subsequently form one or more openings as shown below in FIG. 4D. For example, a light source 460 (e.g., an ultraviolet lamp) may be applied to the intensity regions 450a-b of the mask 450 as light 461 is selectively exposed onto the PID 440 at the designation locations 440a to subsequently form the openings over the routing traces 411a-b. For one embodiment, the PID 440 may be implemented with a lamination, spray coating, spin coating, or other known deposition methods, and may include PID materials as are known in the art.

Figure 4D:
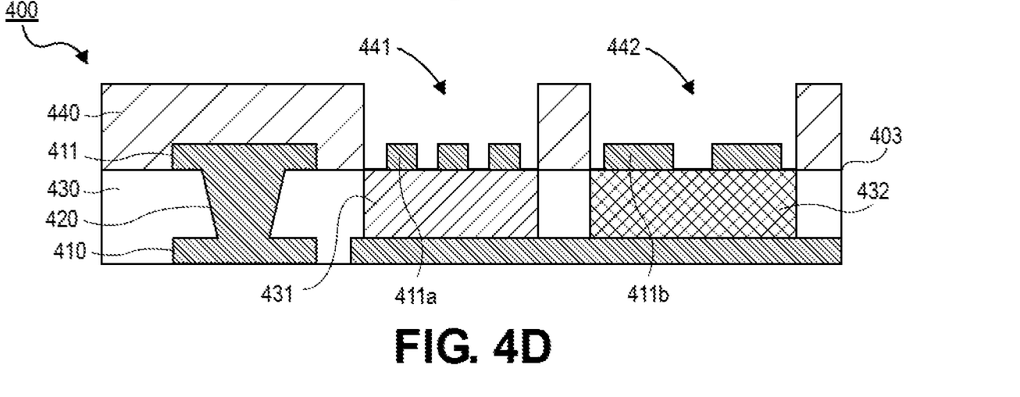

Referring now to FIG. 4D, a cross-sectional illustration of a semiconductor package 400 with openings 441-442 is shown, in accordance with an embodiment. In an embodiment, a plurality of openings 441-442 may be patterned in the PID 440 to expose the routing traces 411a-b, respectively. In one embodiment, the PID 440 may be developed (or patterned) to form the openings 441-442 at the designated locations to subsequently dispose the high and low Dk materials of the high and low Dk regions 431-432, respectively, as shown below.

Figure 4E:
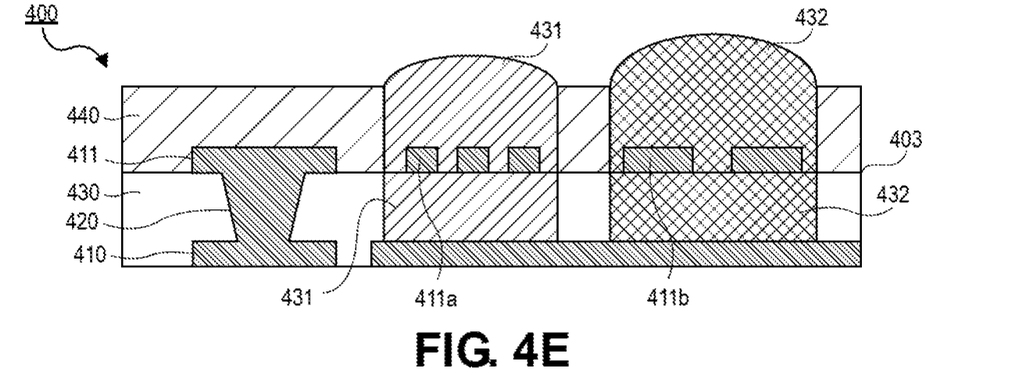

Referring now to FIG. 4E, a cross-sectional illustration of a semiconductor package 400 with overfilled high and low Dk regions 431-432 is shown, in accordance with an embodiment. In an embodiment, a high Dk region 431 and a low Dk region 432 may be disposed (or dispensed/printed) by overfilling a high Dk material and a low Dk material, respectively, into the openings 441-442 shown above in FIG. 4D. In one embodiment, the high and low Dk regions 431-432 may be implemented by a dispensing process, a screen printing process, or the like. In some embodiments, the high and low Dk materials of the high and low Dk regions 431-432 may be substantially similar to the high and low Dk materials of the high and low Dk regions 331-332 described above in FIGS. 3A-3D.

Figure 4F:
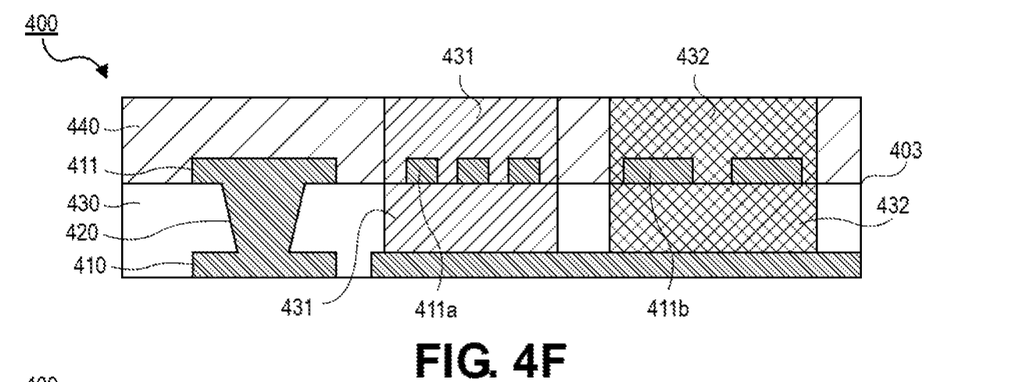
Figure 4G:
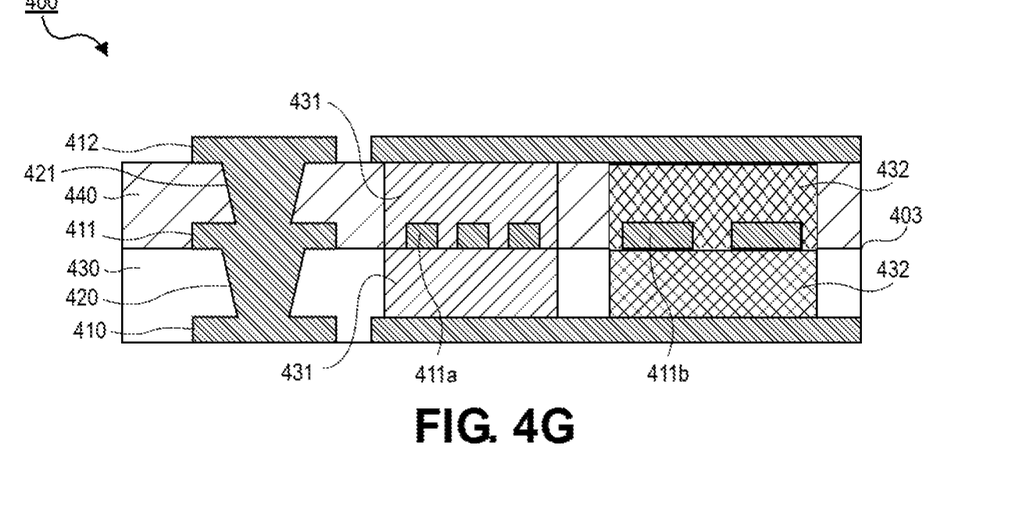

Referring now to FIG. 4F, a cross-sectional illustration of a semiconductor package 400 is shown after a planarization process, in accordance with an embodiment. In an embodiment, a planarization process, a grinding process, or the like may be implemented on the high and low Dk regions 431-432 to planarize (or flatten) the excessive material over the top surfaces of such regions 431-432. As such, in some embodiments, after the planarization/grinding process, the high and low Dk regions 431-432 may have top surfaces that are substantially coplanar to top surfaces of the PID 440.

In one embodiment, the high Dk regions 431 may be implemented for a single-ended breakout routing interface and may have a footprint of approximately 8 mm×2 mm. In one embodiment, the low Dk regions 432 may be implemented for a differential routing interface and may cover a footprint of approximately 30 mm×20 mm. Accordingly, in some embodiments, the high Dk regions 431 may have a footprint that is greater than a footprint of the low Dk regions 432.

According to some embodiments, the Dk values of the high and low Dk regions 431-432 may be tailored for any desired/specific application by reformulating one or more material compositions. For example, in one embodiment, the high Dk region 431 may have a Dk value of approximately 4 or greater. In other embodiments, the high Dk region 431 may have a Dk value of approximately 10 or greater. For one embodiment, the low Dk region 432 may have a Dk value of approximately 2.65 or less. In other embodiments, the low Dk region 432 may have a Dk value of approximately 3.2 or less. In one embodiment, the dielectric layer 430 may have a Dk value of approximately 3.3. In other embodiments, the dielectric layer 430 may have a Dk value of approximately 3.5. As described above, to optimize the signaling performance of the semiconductor package 400, the high and low Dk regions 431-432 may need to be disposed above, around and, below the signal routing traces 411a-b traces.

Referring now to FIG. 4G, a cross-sectional illustration of a semiconductor package 400 with a third conductive layer 412 and a plurality of second vias 421 is shown, in accordance with an embodiment. In an embodiment, the third conductive layer 412 may be disposed over the stacked dielectrics 430 and 440, and the high and low Dk regions 431-432. The third conductive layer 412 may be coupled to the second conductive layer 411 with the vias 421. For some embodiments, the first and third conductive layers 410 and 412 may embed (or sandwich) the high and low Dk regions 431-432. In one embodiment, the third conductive layer 412 and vias 421 may be formed with any plating process, such as a SAP process or the like. In additional embodiments, the steps illustrated in FIGS. 4A-4G may be repeated as needed based on the desired application and/or packaging design.

Note that, in one embodiment, the semiconductor package 400 of FIGS. 4A-4G may be formed (or fabricated) in a different patterning sequence, where the dielectrics 431 and 432 may be applied before the dielectric layer 440. In this embodiment above, the dielectrics 431 and 432 may be PID materials, which may be applied and patterned using the lithography methods described above. After patterning, the PIDs 431 and 432 remain on the substrate 403, where the rest of the areas are exposed (or open) for the dielectric layer 440 to fill in the subsequent steps. Depending on the PID/dielectric material properties, one may choose the patterning sequence favoring the selected material property (or properties).

Also note that the semiconductor package 400 of FIGS. 4A-4G may include fewer or additional packaging components based on the desired packaging design.

Figure 5:
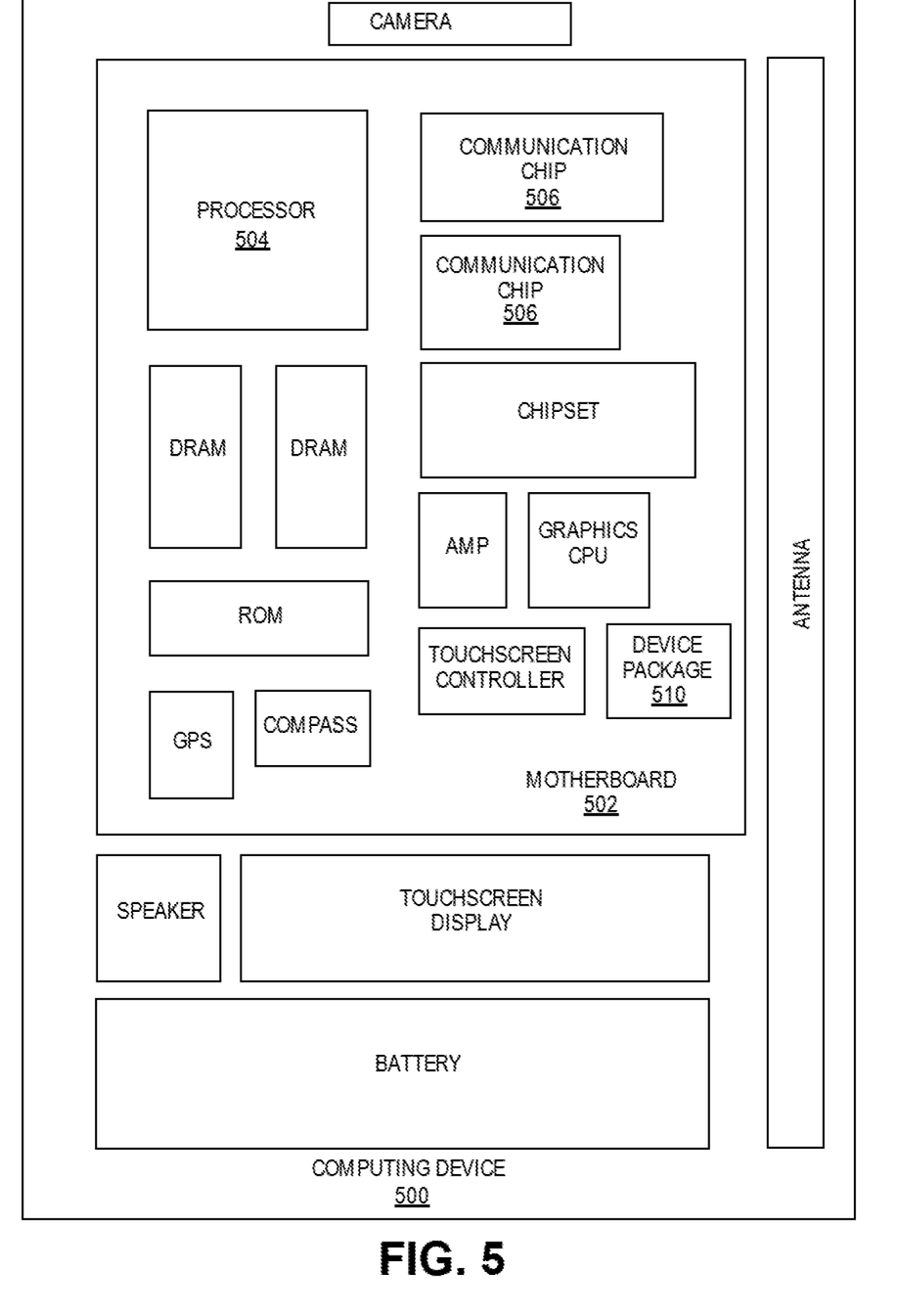
FIG. 5 is an illustration of a schematic block diagram illustrating a computer system that utilizes a semiconductor package with a package substrate that includes a single-ended I/O interface, a differential I/O interface, and a plurality of Dk regions within a dielectric, according to one embodiment.

FIG. 5 is an illustration of a schematic block diagram illustrating a computer system 500 that utilizes a device package 510 (or a semiconductor package) with a package substrate having a single routing layer with single-ended routing traces and differential routing traces and a dielectric with high and low Dk regions, where the single-ended routing traces are surrounded with the higher Dk region and the differential routing traces are surrounded with the lower Dk region, according to one embodiment. FIG. 5 illustrates an example of computing device 500.

Computing device 500 houses motherboard 502. Motherboard 502 may include a number of components, including but not limited to processor 504, device package 510 (or semiconductor package), and at least one communication chip 506. Processor 504 is physically and electrically coupled to motherboard 502. For some embodiments, at least one communication chip 506 is also physically and electrically coupled to motherboard 502. For other embodiments, at least one communication chip 506 is part of processor 504.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 506 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. Device package 510 may be, but is not limited to, a substrate, a package substrate, and/or a PCB. In one embodiment, device package 510 may be a semiconductor package as described herein. Device package 510 may include a package substrate with single-ended and differential I/O routing traces surrounded by a stack of dielectrics with high and low Dk regions as described herein (e.g., as illustrated in FIGS. 1-4G)—or any other components from the figures described herein.

Note that device package 510 may be a single component/device, a subset of components, and/or an entire system, as the materials, features, and components may be limited to device package 510 and/or any other component of the computing device 500 that may need high and low Dk regions surrounding single-ended and differential traces within one or more dielectrics as described herein (e.g., the motherboard 502, the processor 504, and/or any other component of the computing device 500 may need the embodiments of the semiconductor packages as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 506 also includes an integrated circuit die packaged within the communication chip 506. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a package substrate, comprising: a first conductive layer in a first dielectric; a second dielectric over the first dielectric; a second conductive layer in the second dielectric, wherein the second conductive layer includes a plurality of first traces and a plurality of second traces; a third conductive layer over the second dielectric; and a high dielectric constant (Dk) region and a low DK region in the first and second dielectrics, wherein the high Dk region surrounds the plurality of first traces, and wherein the low Dk region surrounds the plurality of second traces.

In example 2, the subject matter of example 1 can optionally include that the high Dk region is between the first conductive layer and the third conductive layer.

In example 3, the subject matter of examples 1-2 can optionally include that the low Dk region is between the first conductive layer and the third conductive layer.

In example 4, the subject matter of examples 1-3 can optionally include a dielectric region in the first and second dielectrics, wherein the dielectric region separates the high Dk region and the low Dk region.

In example 5, the subject matter of example 4 can optionally include that the high Dk region includes a first material having a first Dk value, wherein the dielectric region includes a second material having a second Dk value, wherein the low Dk region includes a third material having a third Dk value, wherein the first Dk value of the high Dk region is greater than the third Dk value of the low Dk region, and wherein the second Dk value of the first and second dielectrics is between the first Dk value and the third Dk value.

In example 6, the subject matter of example 5 can optionally include that the third Dk value is between 3.3 and 3.5.

In example 7, the subject matter of examples 1-6 can optionally include that the plurality of first traces are a plurality of single-ended routing traces, and wherein the plurality of second traces are a plurality of differential routing traces.

In example 8, the subject matter of examples 6 can optionally include that the plurality of single-ended routing traces have a width and a line spacing that is lower than a width and a line spacing of the plurality of differential routing traces.

In example 9, the subject matter of examples 1-8 can optionally include a plurality of vias in the first and second dielectrics, wherein the plurality of vias couple a conductive pad of the second conductive layer to the first and second conductive layers.

Example 10 is a semiconductor package, comprising: a package substrate; a plurality of dielectric regions in the package substrate, wherein the plurality of dielectric regions include a high Dk region, a low Dk region, and a dielectric region; and a die on the package substrate, wherein the die has a first edge with a first input/output (I/O) routing region, and a second edge with a second I/O routing region, wherein the first I/O routing region of the first edge is opposite to the second I/O routing region of the second edge, and wherein the high Dk region includes the first I/O routing region, and the low Dk region includes the second I/O routing region.

In example 11, the subject matter of example 10 can optionally include a first conductive layer in a first dielectric; a second dielectric over the first dielectric; a second conductive layer in the second dielectric, wherein the second conductive layer includes a plurality of first traces and a plurality of second traces, wherein the plurality of first traces are positioned in the first I/O routing region, and wherein the plurality of second traces are positioned in the second I/O routing region; a third conductive layer over the second dielectric; and the high Dk region and the low DK region in the first and second dielectrics, wherein the high Dk region surrounds the plurality of first traces, and wherein the low Dk region surrounds the plurality of second traces.

In example 12, the subject matter of example 11 can optionally include that the high Dk region is between the first conductive layer and the third conductive layer.

In example 13, the subject matter of example 11 can optionally include that the low Dk region is between the first conductive layer and the third conductive layer.

In example 14, the subject matter of example 11 can optionally include that the dielectric region is in the first and second dielectrics, wherein the dielectric region separates the high Dk region and the low Dk region.

In example 15, the subject matter of example 14 can optionally include that the high Dk region includes a first material having a first Dk value, wherein the dielectric region includes a second material having a second Dk value, wherein the low Dk region includes a third material having a third Dk value, wherein the first Dk value of the high Dk region is greater than the third Dk value of the low Dk region, and wherein the second Dk value of the first and second dielectrics is between the first Dk value and the third Dk value.

In example 16, the subject matter of example 15 can optionally include that the third Dk value is between 3.3 and 3.5.

In example 17, the subject matter of example 11 can optionally include that the plurality of first traces are a plurality of single-ended routing traces, and wherein the plurality of second traces are a plurality of differential routing traces.

In example 18, the subject matter of example 17 can optionally include that the plurality of single-ended routing traces have a width and a line spacing that is lower than a width and a line spacing of the plurality of differential routing traces.

In example 19, the subject matter of example 11 can optionally include that a plurality of vias in the first and second dielectrics, wherein the plurality of vias couple a conductive pad of the second conductive layer to the first and second conductive layers.

Example 20 is a method of forming a package substrate, comprising: disposing a first high Dk region and a first low DK region over a first conductive layer; disposing a first dielectric over the first conductive layer and surrounding the first high and low Dk regions; disposing a second conductive layer over the first dielectric and the first high and low Dk regions, wherein the second conductive layer includes a plurality of first traces and a plurality of second traces, and wherein the plurality of first traces are positioned over the first high Dk region, and the plurality of second traces are positioned over the first low Dk region; disposing a second high Dk region directly over the first high Dk region and the plurality of first traces, and a second low Dk region directly over the first low Dk region and the plurality of second traces; disposing a second dielectric over the second conductive layer and surrounding the second high and low Dk regions; and disposing a third conductive layer over the second dielectric and the second high and low Dk regions, wherein the first and second high Dk regions entirely surround the plurality of first traces, and wherein the first and second low Dk regions entirely surround the plurality of second traces.

In example 21, the subject matter of example 20 can optionally include that the first and second high Dk regions are between the first conductive layer and the third conductive layer, and wherein the first and second low Dk regions are between the first conductive layer and the third conductive layer.

In example 22, the subject matter of examples 20-21 can optionally include a dielectric region in the first and second dielectrics, wherein the dielectric region separates the first and second high Dk regions and the first and second low Dk regions; and a plurality of vias in the first and second dielectrics, wherein the plurality of vias couple a conductive pad of the second conductive layer to the first and second conductive layers.

In example 23, the subject matter of example 22 can optionally include that the first and second high Dk regions include a first material having a first Dk value, wherein the dielectric region includes a second material having a second Dk value, wherein the first and second low Dk regions include a third material having a third Dk value, wherein the first Dk value of the first and second high Dk regions is greater than the third Dk value of the first and second low Dk regions, wherein the second Dk value of the first and second dielectrics is between the first Dk value and the third Dk value, and wherein the third Dk value is between 3.3 and 3.5.

In example 24, the subject matter of example 22 can optionally include that the plurality of first traces are a plurality of single-ended routing traces, wherein the plurality of second traces are a plurality of differential routing traces, and wherein the plurality of single-ended routing traces have a width and a line spacing that is lower than a width and a line spacing of the plurality of differential routing traces.

In example 25, the subject matter of examples 20-24 can optionally include that disposing the first and second high and low Dk regions is implemented with a pick and place process or a stack of photoimageable dielectrics.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A package substrate, comprising:
   a first conductive layer in a first dielectric;
   a second dielectric over the first dielectric;
   a second conductive layer in the second dielectric, wherein the second conductive layer includes a plurality of first traces and a plurality of second traces;
   a third conductive layer over the second dielectric; and
   a high dielectric constant (Dk) region and a low DK region in the first and second dielectrics, wherein the high Dk region surrounds the plurality of first traces, and wherein the low Dk region surrounds the plurality of second traces.

2. The package substrate of claim 1, wherein the high Dk region is between the first conductive layer and the third conductive layer.

3. The package substrate of claim 1, wherein the low Dk region is between the first conductive layer and the third conductive layer.

4. The package substrate of claim 1, further comprising a dielectric region in the first and second dielectrics, wherein the dielectric region separates the high Dk region and the low Dk region.

5. The package substrate of claim 4, wherein the high Dk region includes a first material having a first Dk value, wherein the dielectric region includes a second material having a second Dk value, wherein the low Dk region includes a third material having a third Dk value, wherein the first Dk value of the high Dk region is greater than the third Dk value of the low Dk region, and wherein the second Dk value of the first and second dielectrics is between the first Dk value and the third Dk value.

6. The package substrate of claim 5, wherein the third Dk value is between 3.3 and 3.5.

7. The package substrate of claim 1, wherein the plurality of first traces are a plurality of single-ended routing traces, and wherein the plurality of second traces are a plurality of differential routing traces.

8. The package substrate of claim 6, wherein the plurality of single-ended routing traces have a width and a line spacing that is lower than a width and a line spacing of the plurality of differential routing traces.

9. The package substrate of claim 1, further comprising a plurality of vias in the first and second dielectrics, wherein the plurality of vias couple a conductive pad of the second conductive layer to the first and second conductive layers.

10. A semiconductor package, comprising:
a package substrate;
a plurality of dielectric regions in the package substrate, wherein the plurality of dielectric regions include a high Dk region, a low Dk region, and a dielectric region; and
a die on the package substrate, wherein the die has a first edge with a first input/output (I/O) routing region, and a second edge with a second I/O routing region, wherein the first I/O routing region of the first edge is opposite to the second I/O routing region of the second edge, and wherein the high Dk region includes the first I/O routing region, and the low Dk region includes the second I/O routing region.

11. The semiconductor package of claim 10, wherein the package substrate further includes
a first conductive layer in a first dielectric;
a second dielectric over the first dielectric;
a second conductive layer in the second dielectric, wherein the second conductive layer includes a plurality of first traces and a plurality of second traces, wherein the plurality of first traces are positioned in the first I/O routing region, and wherein the plurality of second traces are positioned in the second I/O routing region;
a third conductive layer over the second dielectric; and
the high Dk region and the low DK region in the first and second dielectrics, wherein the high Dk region surrounds the plurality of first traces, and wherein the low Dk region surrounds the plurality of second traces.

12. The semiconductor package of claim 11, wherein the high Dk region is between the first conductive layer and the third conductive layer.

13. The semiconductor package of claim 11, wherein the low Dk region is between the first conductive layer and the third conductive layer.

14. The semiconductor package of claim 11, wherein the dielectric region is in the first and second dielectrics, wherein the dielectric region separates the high Dk region and the low Dk region.

15. The semiconductor package of claim 14, wherein the high Dk region includes a first material having a first Dk value, wherein the dielectric region includes a second material having a second Dk value, wherein the low Dk region includes a third material having a third Dk value, wherein the first Dk value of the high Dk region is greater than the third Dk value of the low Dk region, and wherein the second Dk value of the first and second dielectrics is between the first Dk value and the third Dk value.

16. The semiconductor package of claim 15, wherein the third Dk value is between 3.3 and 3.5.

17. The semiconductor package of claim 11, wherein the plurality of first traces are a plurality of single-ended routing traces, and wherein the plurality of second traces are a plurality of differential routing traces.

18. The semiconductor package of claim 17, wherein the plurality of single-ended routing traces have a width and a line spacing that is lower than a width and a line spacing of the plurality of differential routing traces.

19. The semiconductor package of claim 11, further comprising a plurality of vias in the first and second dielectrics, wherein the plurality of vias couple a conductive pad of the second conductive layer to the first and second conductive layers.

* * * * *